United States Patent [19]
Keough

[11] 3,831,063
[45] Aug. 20, 1974

[54] KEYBOARD ELECTRONIC APPARATUS AND METHOD OF MAKING

[75] Inventor: Laurence J. Keough, Walpole, Mass.

[73] Assignee: Texas Instruments Incorporated, Dallas, Tex.

[22] Filed: Nov. 17, 1972

[21] Appl. No.: 307,706

[52] U.S. Cl. .......... 317/101 D, 200/159 B, 335/145
[51] Int. Cl. .......... H02b 1/02
[58] Field of Search .......... 200/159 B; 317/101 CC, 317/101 CM, 101 D, 101 DH; 235/145 R

[56] References Cited

UNITED STATES PATENTS

| | | | |
|---|---|---|---|
| 2,650,415 | 9/1953 | Kingman | 317/101 CC |
| 2,737,729 | 6/1973 | Carney | 317/101 DH |
| 2,740,097 | 3/1956 | Edelman et al. | 317/101 CC |
| 3,292,125 | 12/1966 | Berry | 235/145 R |
| 3,707,609 | 12/1972 | Dapot et al. | 200/159 B |

*Primary Examiner*—David Smith, Jr.
*Attorney, Agent, or Firm*—Harold Levine; John A. Haug; James P. McAndrews

[57] ABSTRACT

A novel and improved keyboard-operated electronic apparatus is shown to incorporate at least two printed circuit boards and to utilize novel and advantageous means for electrically interconnecting selected circuit paths on the two boards. A novel and improved method for assembling the keyboard-operated electronic apparatus is also shown. In the disclosed method and apparatus, a strip of normally shape-retaining but bendable electrically-conductive metal material is blanked to form a plurality of normally shape-retaining but bendable leads which are held in spaced, side-by-side, parallel relation to each other by integral web portions of the strip material. Preferably the leads are blanked in a selected configuration providing the leads with a common, preferential bending direction. Corresponding first ends of the leads are then inserted into apertures in a first printed circuit board such as a printed circuit keyboard and are simultaneously soldered to selected circuit paths on the first board, preferably at the same time that all keyboard components are soldered to said circuit paths. The web portions of the strip material are then cut from the leads for separating the leads and, while the leads are retained in spaced, side-by-side parallel relation to each other in the first board, the opposite ends of the leads are inserted into apertures in a second printed circuit board such as a board mounting selected electronic components and are simultaneously soldered to selected circuit paths on the second board, preferably at the same time that all of the noted electronic components are soldered to the circuit paths on the second board. The leads are then bent in their common, preferential bending direction to adjustably dispose the two printed circuit boards in closely spaced parallel relation to each other to form a light, compact, easily repairable, and inexpensive apparatus.

3 Claims, 9 Drawing Figures

KEYBOARD ELECTRONIC APPARATUS AND METHOD OF MAKING

Recent developments in the manufacture of printed circuit keyboards and of components to be mounted on electronic panel boards has significantly reduced the size, weight and cost of certain types of electronic apparatus. As a result, large new markets have opened for light, compact and inexpensive electronic devices such as pocket-sized electronic calculators and the like. However, as these manufacturing advances have been realized, the bulk, weight and costs associated with electrically interconnecting printed circuit keyboards with other printed circuit boards within such devices have become increasingly significant and have tended to limit the size, weight and cost reductions that can be reliably achieved in manufacturing the various electronic devices.

It is an object of this invention to provide a novel and improved electronic apparatus such as a keyboard-operated electronic apparatus which incorporates two or more printed circuit boards; to provide such apparatus which utilizes novel and improved means for electrically interconnecting selected circuit paths on such printed circuit boards; to provide such apparatus which is characterized by light weight, small size, easy repairability, and low cost; and to provide novel and improved methods for assembling such apparatus.

Other objects, advantages and details of the novel and improved methods and apparatus provided by this invention appear in the following detailed description of preferred embodiments of the invention, the detailed description referring to the drawings in which.

Figure 1:
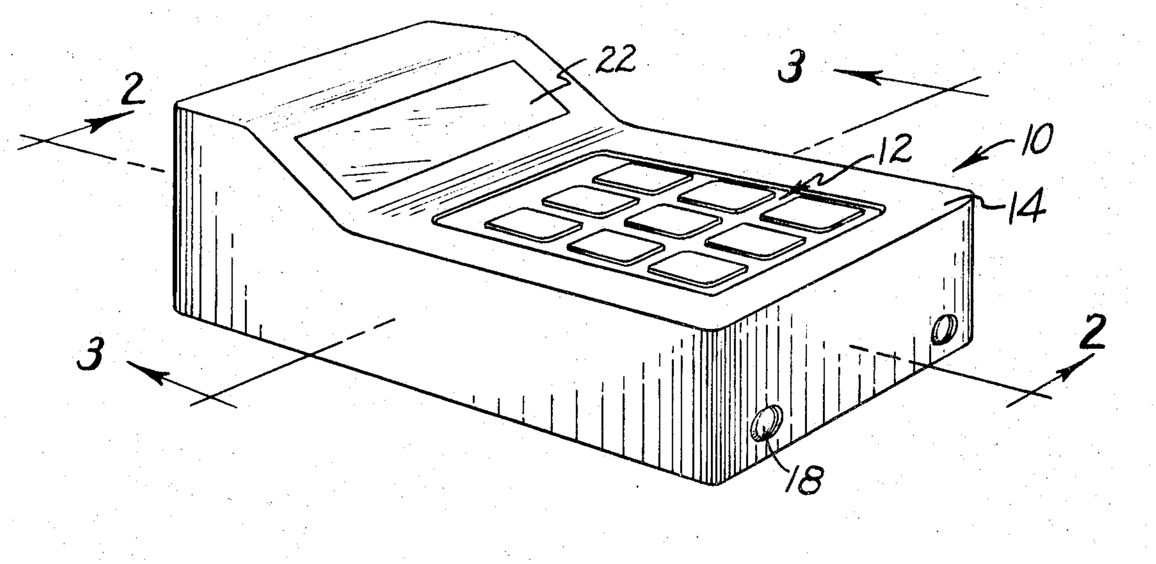
FIG. 1 is a perspective view of an electronic calculator embodying the keyboard-operated electronic apparatus of this invention.
Figure 2:
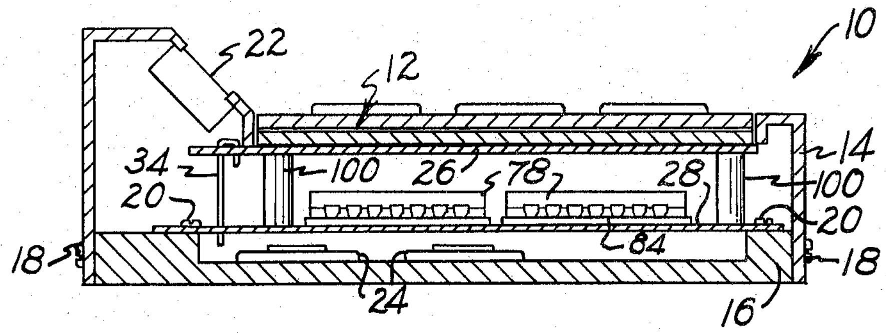
FIG. 2 is a section view along line 2—2 of FIG. 1.
Figure 3:
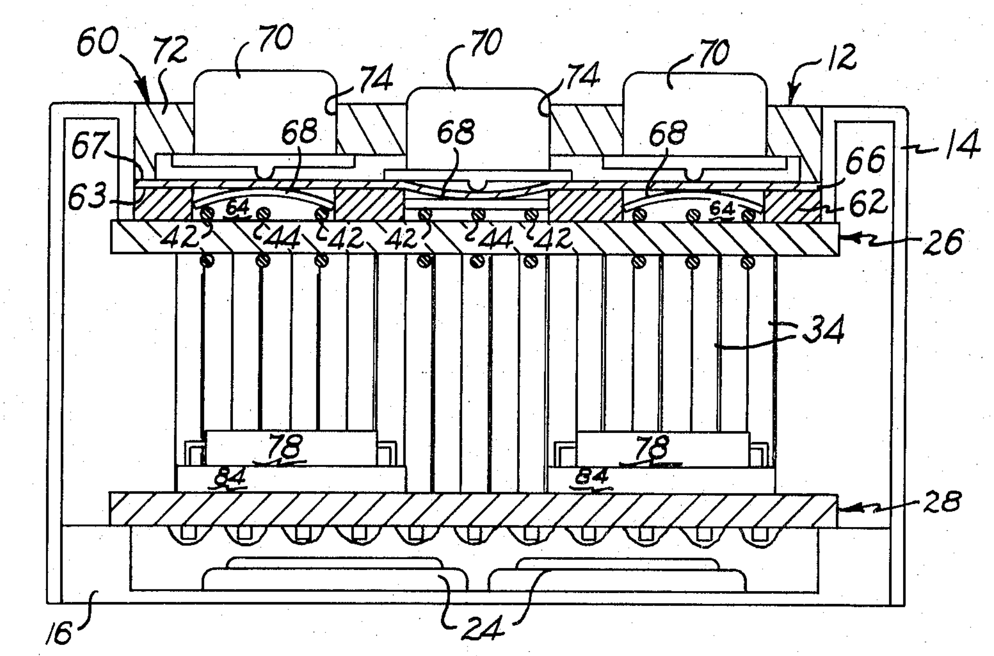
FIG. 3 is a section view along line 3—3 of FIG. 1.

Referring to the drawings, 10 in FIGS. 1–3 indicates a pocket-sized electronic calculator or the like incorporating the novel and improved keyboard-operated electronic apparatus 12 provided by this invention.

As will be understood, the apparatus 12 preferably includes substantially all of the electronic calculating and keyboard control features of the calculator 10, the calculator further including only such conventional device features as a housing 14 secured to a housing base 16 by screw means 18 or the like, screw means 20 detachably securing the electronic keyboard apparatus 12 to the housing base 16, display means 22 of any conventional type electrically connected to the apparatus 12 in any conventional way (not shown) to be responsive to electrical signals received from the apparatus 12 to provide a visual display corresponding to such signals, and battery means 24 electrically connected to the apparatus 12 in any conventional way (not shown) for supplying power to the electronic apparatus 12. As the display, battery and housing means are conventional, they are not further described herein and will be understood that any of the various display, housing and battery means are used with the electronic apparatus 12 within the scope of this invention.

As is best shown in FIGS. 2 and 3, the electronic keyboard apparatus 12 includes one printed circuit board 26 for receiving a keyboard assembly and includes at least one other printed circuit board 28 for mounting the various electronic components conventionally required for performing calculating functions or the like, these printed circuit boards being compactly disposed in a closely spaced, side-by-side parallel relation to each other but having selected circuit paths on the two boards electrically interconnected with each other in such a way that all areas of electronic apparatus 12 are readily accessible for easy repair.

Figure 4:
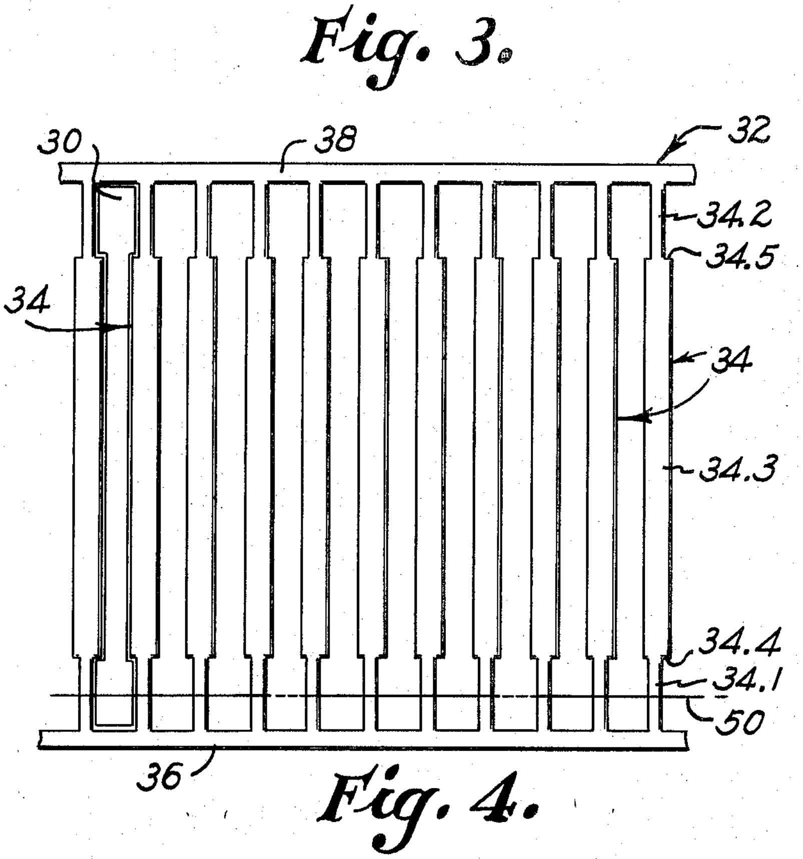
FIG. 4 is a plan elevation view of a multiple lead element made in accordance with the method of this invention.

Referring further to the drawings, FIGS. 4–9 illustrate the novel and advantageous method provided by this invention for economically manufacturing the compact, light, inexpensive and easily repaired apparatus 12. Thus, as shown in FIG. 4, an elongated strip of normally shape-retaining but bendable metal material such as brass or copper having good electrical conductivity characteristics is blanked by mechanical stamping means or the like diagrammatically indicated by the die 30 to form a connector strip 32. As shown, this connector strip embodies a plurality of normally shape-retaining but bendable leads 34 which are held in spaced side-by-side parallel relation to each other by integral web portions 36 and 38 of the strip material. As will be understood, such stamping provides each of the leads 34 with a common thickness corresponding to the thickness of the connector strip material and, in accordance with this invention, lead portions 34.3 intermediate the lead ends 34.1 and 34.2 are formed relatively wider than the common thickness of the leads and extending in a common plane so that the leads have a common, preferential bending direction. Preferably each of the lead ends 34.1 and 34.2 are relatively narrow as shown so that the leads are provided with shoulders 34.4 and 34.5 which are correspondingly spaced from the adjacent ends of the leads as shown in FIG. 4. Typically, for example, the metal material forming the connector strip has a thickness of about 0.007 inches and a width of about 1.00 inches and the leads are blanked to be each about 0.065 inches wide intermediate the lead ends and about 0.020 inches wide adjacent the ends, to have a length of about 0.750 inches, and to have a center-to-center spacing of about 0.125 inches. Preferably the connector strip is tin plated to a thickness of about 0.0003 inches after the leads 34 have been formed in the strip.

Figure 5:
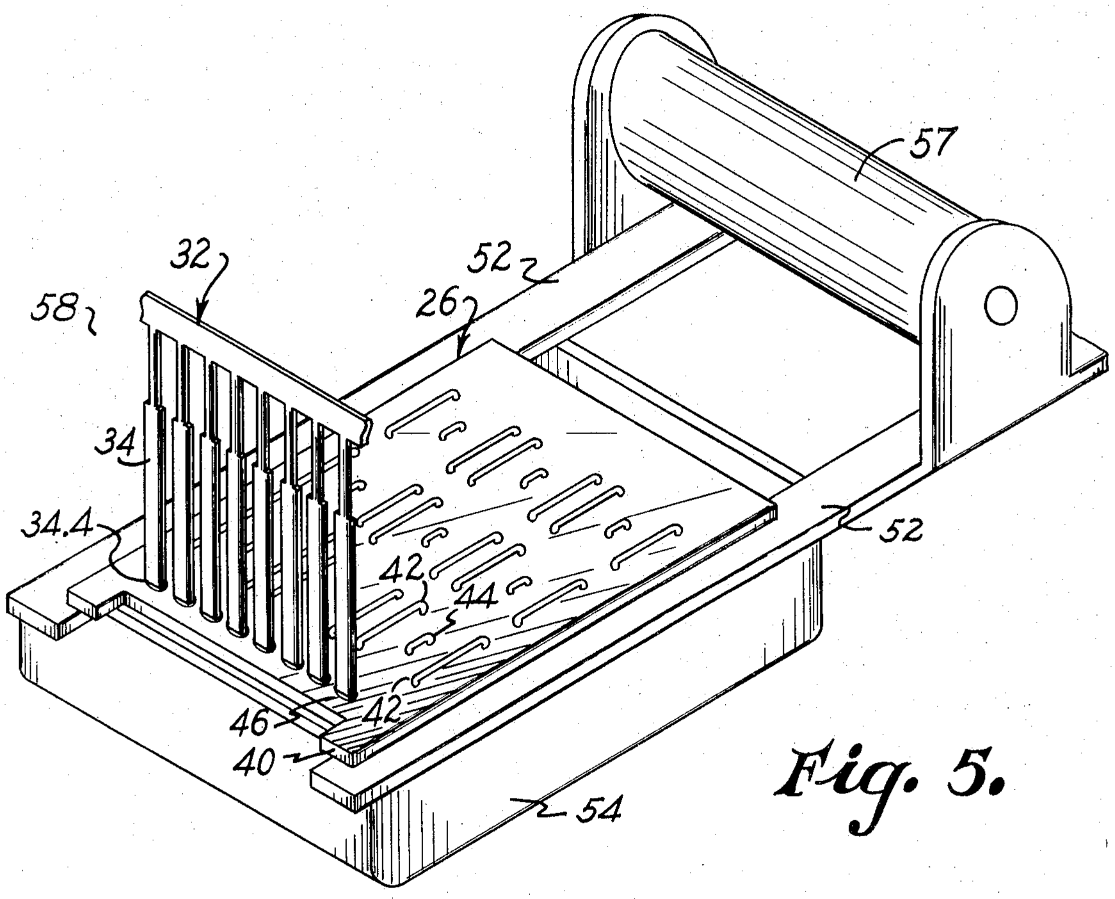
FIG. 5 is a perspective view of the lead element of FIG. 4 illustrating steps in the method of this invention utilizing the lead element in assembling the apparatus of FIG. 1.
Figure 6:
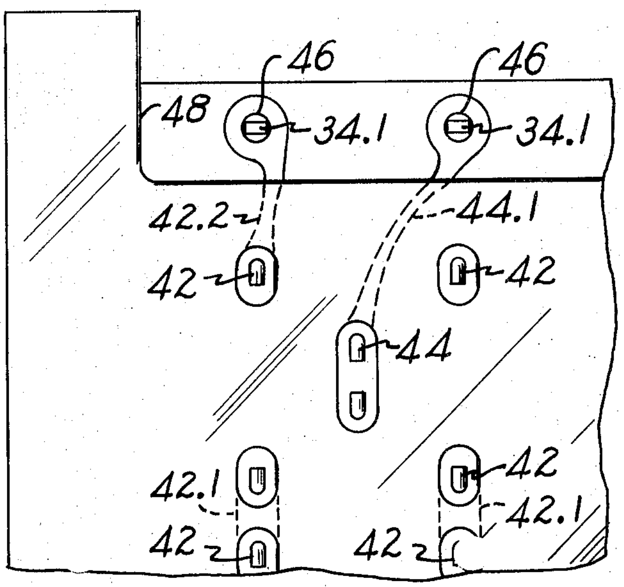
FIG. 6 is a bottom view of a printed circuit board utilized in the apparatus of FIG. 1.

In accordance with this invention, a segment of connector strip 32 having about 10 to 20 leads 34 therein as required is utilized in making electrical connections to selected circuit paths on a printed circuit board 26 as shown in FIGS. 4–6. In this regard, the printed circuit board 26 typically comprises a layer 40 of rigid, dielectric material about 2 by 3 inches and about 0.062 inches thick. Long staples 42 and shorter staples 44, preferably of gold plates brass or the like, are mounted on one side of the board 26 as shown in FIG. 5 so that the staples form electrical contact means for a keyboard and so that the ends of the staples extend through the dielectric layer 40 to the oppostie side of the board 26 to serve as terminals for these contact means, the board also having a row of apertures 46 therein spaced correspondingly to the spacing of the leads 34 as shown in FIGS. 5 and 6. As shown best in FIG. 6, the opposite side of the circuit board 26 is provided with electrically conductive circuit paths 42.1 for electrically interconnecting the ends of the long staples 42 with each other, with a circuit path 42.2 extending from one of the long staples 42 to surround a board aperture 46, and with circuit paths 44.1 extending from the ends of the shorter staples 44 to surround other respective apertures 46 in a circuit board. Preferably this opposite side of the board 26 is coated with a plastic insulating film 48 or the like except around the apertures 46 and around the points of contact between the circuit paths 42.1 and 44.1 and the ends of the staples 42 and 44.

In the method of this invention, one of the integral strip web portions 36 is cut from the ends of the leads 34 as is diagrammatically indicated by the broken line 50 in FIG. 4 for freeing corresponding ends 34.1 of the leads. These lead ends 34.1 are then immediately inserted into respective apertures 46 in the circuit board 26, preferably from the first side of the circuit board so that the lead shoulders 34.4 engage the first side of the board 26 as shown in FIG. 5 and so that the lead ends are disposed adjacent selected circuit paths on the opposite side of the board as shown in FIG. 6. In the preferred embodiment of the method of this invention, the circuit board 26 is then advanced on guides 52 over a solder container 54 so that the ends of the staples 42 and 44 and the lead ends for 34.1 are contacted with the surface of a charge of molten solder 56 within the container 54 for simultaneously soldering lead ends 34.1 and the ends of the staples 42 and 44 to selected circuit paths on the circuit board 26. Preferably the leads 34 are then bent in a direction indicated by the arrow 58 to be substantially parallel to the circuit board as by passing the board 26 under the roll 57 shown in FIG. 5.

Figure 7:
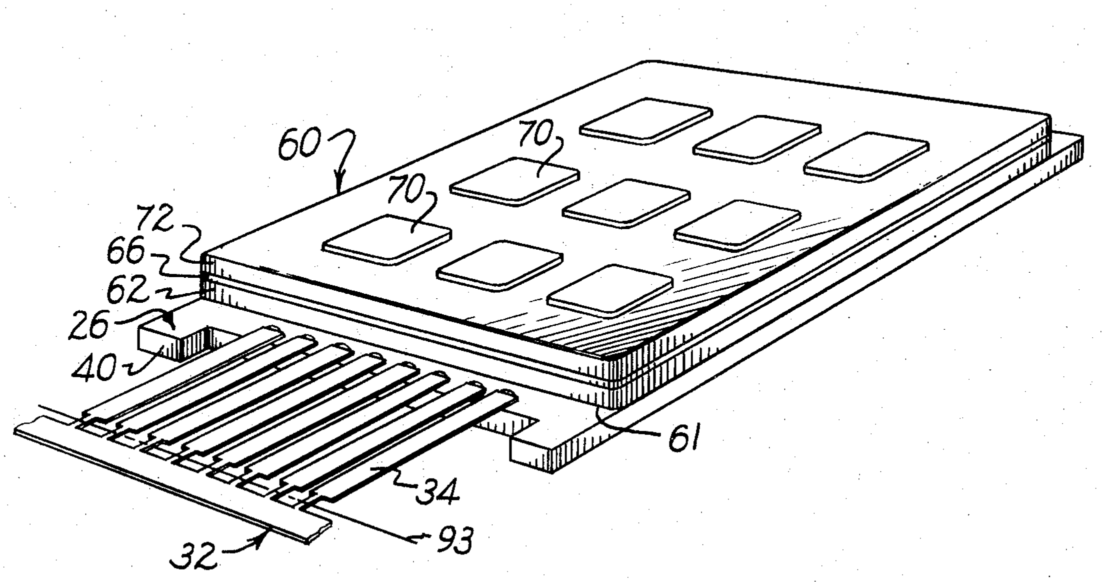
FIG. 7 is a perspective view of the lead element of FIG. 4 illustrating further steps in the method of this invention utilizing the lead element in assembling the apparatus of FIG. 1.

In accordance with the method of this invention, a keyboard assembly 60 of conventional type is then secured onto the circuit board 26 as shown in FIG. 7 for selectively forming electrical connection between sets of keyboard contact means 42 and 44 on the board. Typically, for example, the keyboard assembly 60, best shown in FIG. 3, comprises a rigid frame member 62 of insulating material such as epoxy bonded glass cloth having a plurality of apertures 64, a thin pliable film 66 of polyethylene teraphthalate or the like cemented to the frame member 62 as at 63 to extend over the apertures 64, a plurality of snap-acting metal discs 68 disposed in the respective frame member aperture 64, a plurality of keys 70 of an insulating material arranged in alignment with the respective discs 68, and an additional frame member 72 also of insulating material which is cemented to the film 66 as at 67 and which has apertures 74 fitted over respective key 70 for holding the keys aligned with the discs. Typically, for example, the snap-acting discs 68 are dish-shaped and are formed of gold-plated stainless steel or the like proportioned in conventional ways so that the discs are adapted to be moved from one dished configuration to an inverted dished configuration on the application of pressure but are adapted to return to their original dished configuration when such pressure is released. In this arrangement, as shown in FIG. 3, each of the discs 68 normally rests on a pair of long staples 42 in the circuit board 26 but, when one of the keys 70 is depressed as illustrated in the center of FIG. 3, the disc 68 aligned with that key is moved to its inverted dished configuration with snap-action to also engage one of the short staples 44, thereby electrically interconnecting the short staple with the long staples for closing a circuit as will be understood. The keyboard assembly 60 is cemented or otherwise conventionally secured to the circuit board 26 as indicated at 61. As any of the various conventional keyboard assemblies can be mounted on a circuit board 26 within the scope of this invention, the keyboard assembly is not further described herein and it will be understood that any keyboard assembly adapted to electrically interconnect keyboard contact means which are mounted on a printed circuit board and are electrically connected to the circuit paths on the board are used within the scope of this invention.

Figures 8, 9:
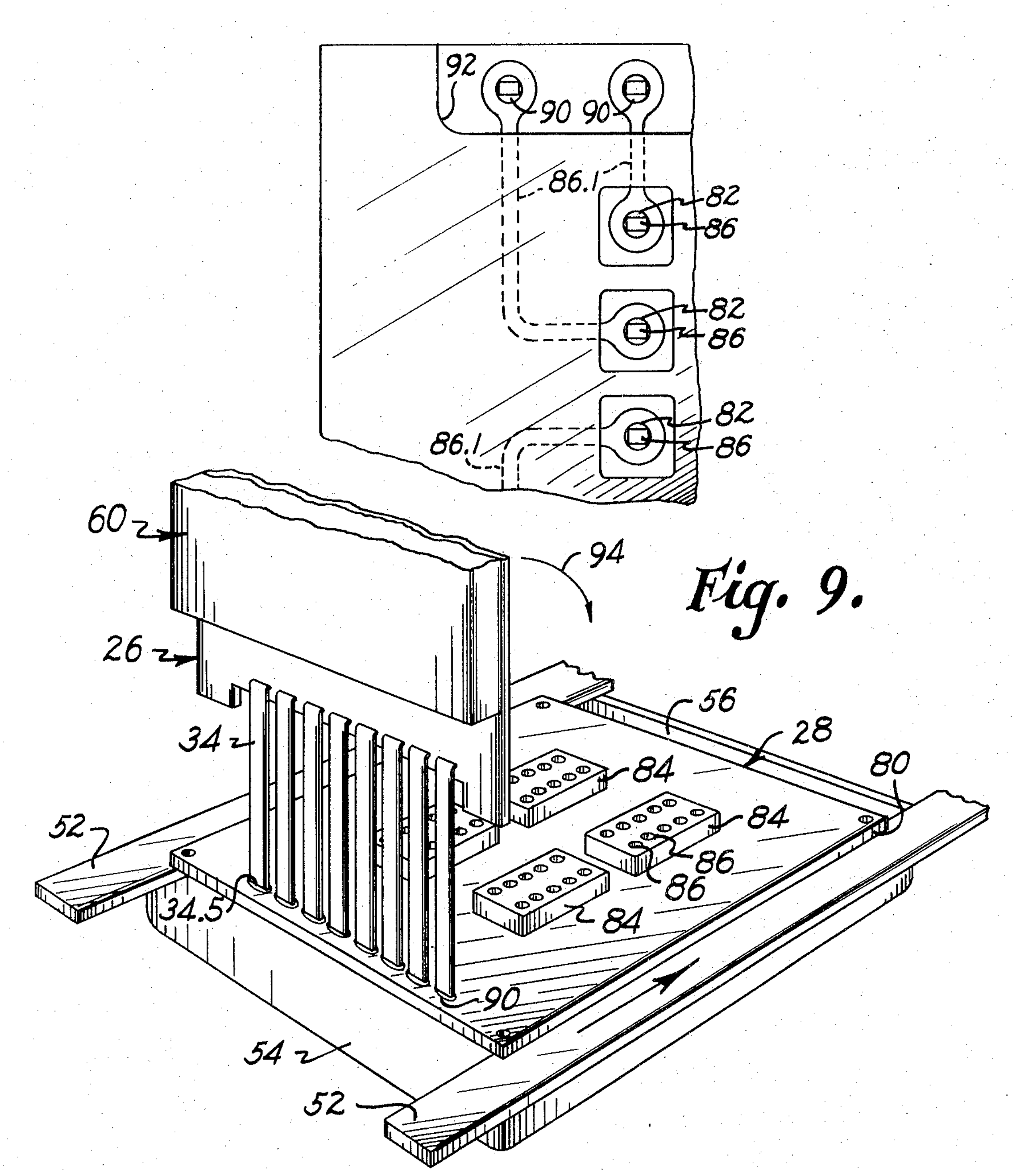
FIG. 8 is a perspective view of the lead element of FIG. 4 illustrating further steps in the method of this invention utilizing the lead element in assembling the apparatus of FIG. 1.
FIG. 9 is a bottom view of another printed circuit board utilized in the apparatus of FIG. 1.

In accordance with this invention, the leads 34 soldered to the circuit paths on the circuit board 26 are then utilized for electrically connecting these circuit paths to other selected circuit paths on the printed circuit board 28. In this regard, the circuit board 28 is of any conventional construction for mounting the electronic components conventionally required for performing calculating functions within the scope of this invention. For example, where electronic calculating functions are to be formed by use of four integrated circuit units 78 (see FIG. 3), the printed circuit board 28 preferably comprises a layer 80 of rigid dielectric material similar to that used on the board 26 and is provided with a plurality of apertures 82 therein as shown in FIG. 9. Conventional connectors 84 for the integrated circuit units 78 are then disposed on one side of the circuit board 28 as is shown in FIG. 8 so that the terminals 86 of the connectors extend through the board apertures 82 to be disposed on the opposite side of the board 28. As shown in FIG. 9, selected circuit paths 86.1 on the board 28 extend from around the board apertures 82 to surround respective additional apertures 90 which are arranged in the board 28 along one edge of the board. Preferably as shown in FIG. 9, the circuit paths 86.1 are covered with a thin insulating film 92 except around the apertures 82 and 90. As will be understood, the connector terminals 86 are adapted to detachably engage terminals on the integrated circuit units 78.

In the method of this invention, the web portion 38 is cut from the connector strip 32 as indicated by the broken line 93 in FIG. 7 so that the leads 34 are held in spaced, side-by-side parallel relation to each other in the board 26 and so that the lead ends 34.2 are freed from each other. As shown in FIG. 8, these free lead ends 34.2 are then inserted into the apertures 90 in the board 28, preferably as soon as they are free and before any misalignment of the leads can occur, so that the lead shoulders 34.5 engage the first side of the board 28 and so that the lead ends 34.2 are disposed adjacent the circuit paths 86.1 on the opposite side of the board.

The board 28 with the connectors 82 mounted thereon and with the lead ends 34.2 therein are then advanced over guides 52 to pass over a solder container 54 in the manner previously described for simultaneously soldering both the connector terminals 86 and the lead ends 34.2 to the circuit paths 86.1 on the circuit board. The integrated circuit units 84 are then detachably mounted on the connectors 82 in a conventional manner for engaging the i.c. unit terminals with the connector terminals as will be understood. The leads 34 are then bent as indicated by the arrow 94 in FIG. 8 for disposing the printed circuit boards 26 and 28 at closely spaced parallel relation to each other, thereby to complete manufacture of the electronic keyboard apparatus 12. The apparatus 12 is then assembled in electronic calculator 10 as previously described and, if preferred, spacer 100 can be disposed between the circuit boards 26 and 28 in any conventional manner.

In this arrangement it can be seen that the leads 34 serve to electrically interconnect selected circuit paths on the printed circuit boards 26 and 28 in a particularly advantageous manner. Thus, the leads are economically formed from a common strip of metal. The leads 34 are held properly spaced from each other to be readily inserted into the apertures in the circuit board 26 by the strip web portion 38, the strip web portion 36 serving to assure that the lead ends 34.1 are very accurately spaced from each other until the web 36 is removed just before the leads are inserted into the apertures in the board 26. Each of the leads has a shoulder to engage the board 26 to assure that the proper lead length is achieved and, where the lead ends 34.1 and the staples 42 and 44 are simultaneously soldered to circuit paths on the board 26, the leads are reliably and economically connected to the these circuit paths without any significant connection expense. Note that it is desirable to subject a board to only a single soldering operation to assure that solder connections made in the first soldering step are not weakened by heat in a subsequent soldering step. Further, because each of the leads 34 has a width extending in a common plane which is greater than the lead thickness, each lead has a common preferential bending direction so that the leads are easily bent as shown in FIG. 5 to facilitate handling, shipping and storing of the printed keyboard assembly shown in FIG. 7 while assuring that the leads remain properly spaced from each other. The web portion 38 is retained on the leads 34 until just before the lead ends 34.2 are inserted into apertures in the circuit board 28, thereby assuring that the lead ends 34.2 are accurately spaced to be easily inserted into the apertures of the board 28. Similarly, the lead ends 34.2 are adapted to be soldered to circuit paths on the board 28 simultaneously with soldering of electronic component leads to the circuit board so that again only one soldering operation need to be performed on the circuit board 28. Finally, because each of the leads 34 has a common preferential bending direction, the leads are readily bent after soldering has been completed for disposing the circuit boards 26 and 28 in closely spaced, parallel relation to each other to form a compact assembly 12 without tending to engage the leads 34 with each other during such bending. Where access to the bottom of the board 26 or to the top of the board 28 is required for performing repairs or for other purposes, the leads 34 are easily bent back along their preferential bending direction to provide such access in a convenient way. In short, the construction of the apparatus 12 provided by this invention achieves the convenience of assembly in repairability usually associated with detachable connections while also achieving the reliability and low connector material costs usually associated with permanently interconnected circuit board structures. Most important, the connector features add no significant weight or bulk to the assembly.

It should be understood that although particular embodiments of the apparatus and methods provided by this invention have been described by way of illustrating this invention, this invention also includes all modifications and equivalents of the disclosed embodiments which fall within the scope of the appended claims.

I claim:

1. An electronic apparatus comprising a first rigid printed circuit board having circuit paths on one side thereof, having an opposite side, and having apertures therein; a second rigid printed circuit board having circuit paths on one side thereof, having an opposite side, and having apertures therein; said second board being disposed with said opposite side thereof in spaced, facing, generally parallel relation to said one side of said first board, and a plurality of normally shape-retaining leads of electrically conductive metal material having selected widths intermediate the lead ends and having relatively smaller widths adjacent said lead ends forming lead shoulders which are commonly spaced from corresponding ends of said leads, said leads having corresponding first ends extending into respective apertures in said first board from said opposite side of said first board with the lead shoulders adjacent said first lead ends engaging said opposite side of said first board, said first lead ends being soldered to selected circuit paths on said one side of said first board, said leads having corresponding opposite ends extending into respective apertures in said second board from said opposite side of said second board with the lead shoulders adjacent said opposite lead ends engaging said opposite side of said second board, and said opposite lead ends being soldered to selected circuit paths on said one side of said second board.

2. An electronic apparatus as set forth in claim 1 wherein said leads comprise a normally shape-retaining but bendable metal material and have a common lead thickness, said leads having said selected widths intermediate the lead ends relatively greater than said common lead thickness and extending in a common plane providing a common, preferential bending direction for said leads, and wherein said circuit boards are disposed in closely spaced parallel relation to each other but are adapted to be moved relative to each other by bending said leads in said common preferential direction to permit access to both sides of said boards without tending to engage said leads with each other.

3. An electronic keyboard apparatus comprising a first rigid printed circuit board having circuit paths on one side thereof, having an opposite side, and having apertures therein; a plurality of electrical contact means mounted on said opposite side of said first board having contact terminals extending into respective first board apertures and soldered to selected circuit paths on said one side of said first board; keyboard means mounted on said opposite side of said first board for selectively engaging said electrical contact means; a second rigid printed circuit board having circuit paths on one side thereof, having an opposite side, and having apertures therein; electronic component means mounted on said opposite side of said second board having component terminals extending into respective second board apertures and soldered to selected circuit paths on said one side of said second board; and a plurality of normally shape-retaining but bendable leads of electrically conductive metal material having a common lead thickness, having widths intermediate the lead ends relatively greater than said common thickness extending in a common plane providing a common, preferential bending direction for said leads, and having relatively smaller widths adjacent said lead ends forming lead shoulders which are commonly spaced from corresponding ends of said leads, said leads having corresponding first ends extending into respective apertures in said first board from said opposite side of said first board with the lead shoulders adjacent said first lead ends engaging said opposite side of said first board, said first lead ends being soldered to selected circuit paths on said one side of said first board, said leads having corresponding opposite ends extending into respective apertures in said second board from said opposite side of said second board with the lead shoulders adjacent said opposite lead ends engaging said opposite side of said second board, said opposite lead ends being soldered to selected circuit paths on said one side of said second board, said leads being bent in said preferential direction movably disposing said boards in closely spaced parallel relation to each other with said opposite side of said second board in facing relation to said one side of said first board while retaining said leads in spaced relation to each other.

* * * * *